March 15, 1955 C. K. LAW 2,704,329

FREQUENCY CONTROL SYSTEM

Filed July 25, 1951 3 Sheets-Sheet 1

INVENTOR
Charles K. Law
BY
Charles H. Brown
ATTORNEY

INVENTOR
Charles K. Law
BY
Charles H. Brown
ATTORNEY

INVENTOR
Charles K. Law
BY
Charles H. Brown
ATTORNEY

United States Patent Office 2,704,329

Patented Mar. 15, 1955

2,704,329

FREQUENCY CONTROL SYSTEM

Charles K. Law, Haddon Heights, N. J., assignor to Radio Corporation of America, a corporation of Delaware Application July 25, 1951, Serial No. 238,483

17 Claims. (Cl. 250—36)

This invention relates to a frequency control system, and more particularly to a system for controlling the frequency of a variable frequency oscillator used as a master oscillator for heterodyning purposes in a communications radio transmitter-receiver.

Certain applications of communications transmitter-receivers, for example military applications, require that the radio transmitter and receiver be capable of extremely rapid tuning to any preselected one of a large number of radio frequency channels. For this purpose, a variable frequency oscillator is required in the transmitter-receiver and this oscillator should be crystal controlled so that it will be brought accurately to the desired required frequency. As a typical example, in a transmitter-receiver built according to this invention and successfully tested, the antenna frequency was variable from 225 to 399.9 mc. and it was desired that the transmitter-receiver be tunable to any one of the 1750 channels spaced 100 kc. apart throughout this frequency range.

Although the variable frequency oscillator should be crystal controlled, for various reasons it is desirable to minimize the total number of crystals which is required. According to this invention, any one of 1750 channels may be selected while requiring a total of only fifteen crystals.

An object of this invention is to devise a novel automatic tuning system for an oscillator, whereby such oscillator may be selectively tuned automatically to any one of a large number of frequencies.

Another object is to provide a novel automatic tuning system for an oscillator, whereby the tuning operation is completed in a time interval much shorter than that required by former systems.

A further object is to devise a novel combined reactance tube-motor tuning control system for an oscillator in which the motor rapidly retunes the oscillator in the event it tends to drift excessively in frequency.

A still further object is to devise a tuning system using a phase discriminator as a frequency comparing circuit, in which the possibility of false discriminator responses at points removed from the correct tuning point, is obviated.

Another object is to enable the automatic tuning over a relatively large range of an oscillator, in a radio frequency system, in two successive steps, the first of which is effected primarily by a mechanical operation and the second of which is effected by an electrical operation which provides a finer tuning control.

Yet another object is to devise an automatic tuning system for an oscillator, whereby the oscillator may be selectively tuned automatically to any one of a large number of predetermined frequencies, the oscillator having crystal stability, yet wherein the number of crystals required is reduced to a minimum.

The foregoing and other objects of the invention will be best understood from the following description of an exemplification thereof, reference being had to the accompanying drawings, wherein:

Fig. 1 (composed of two portions labeled Fig. 1*a* and Fig. 1*b*) is a part detailed, part schematic circuit diagram of a frequency control system according to this invention;

The objects of this invention are accomplished, briefly, in the following manner: The output of the variable frequency master oscillator in the transmitter-receiver is mixed in a plurality of cascaded mixers with oscillatory energy derived from a plurality of crystal oscillators the frequencies of which are selectively variable by means of switching of crystals. The outputs of the final crystal oscillator and of the final mixer are compared in a phase discriminator the output of which controls a tuning motor for the variable frequency oscillator, through a relay system, and also controls a reactance tube coupled to the variable frequency oscillator. The combination reactance tube-motor control system, operated from the phase discriminator output, functions to very rapidly tune the variable frequency oscillator to the correct frequency as selected by the crystal selector switches. Normally, the reactance tube operates to keep the variable frequency oscillator on the proper frequency if it tends to drift therefrom. If the variable frequency oscillator tends to drift excessively, the motor control circuit again comes into operation to rapidly retune the variable frequency oscillator to the proper frequency. A "permissive circuit" is provided to permit tuning of the variable frequency oscillator only over a restricted range of positions of the tuning capacitor of such oscillator. The maximum time required for one complete tuning cycle of the oscillator is four seconds, while retuning for slow variations in the circuit, such as drift of the variable frequency oscillator, takes about one second. In an arrangement according to this invention which was actually built and tested, tuning cycle operations have consistently been completed in time intervals on the order of two and one-half seconds.

Figure 1A:
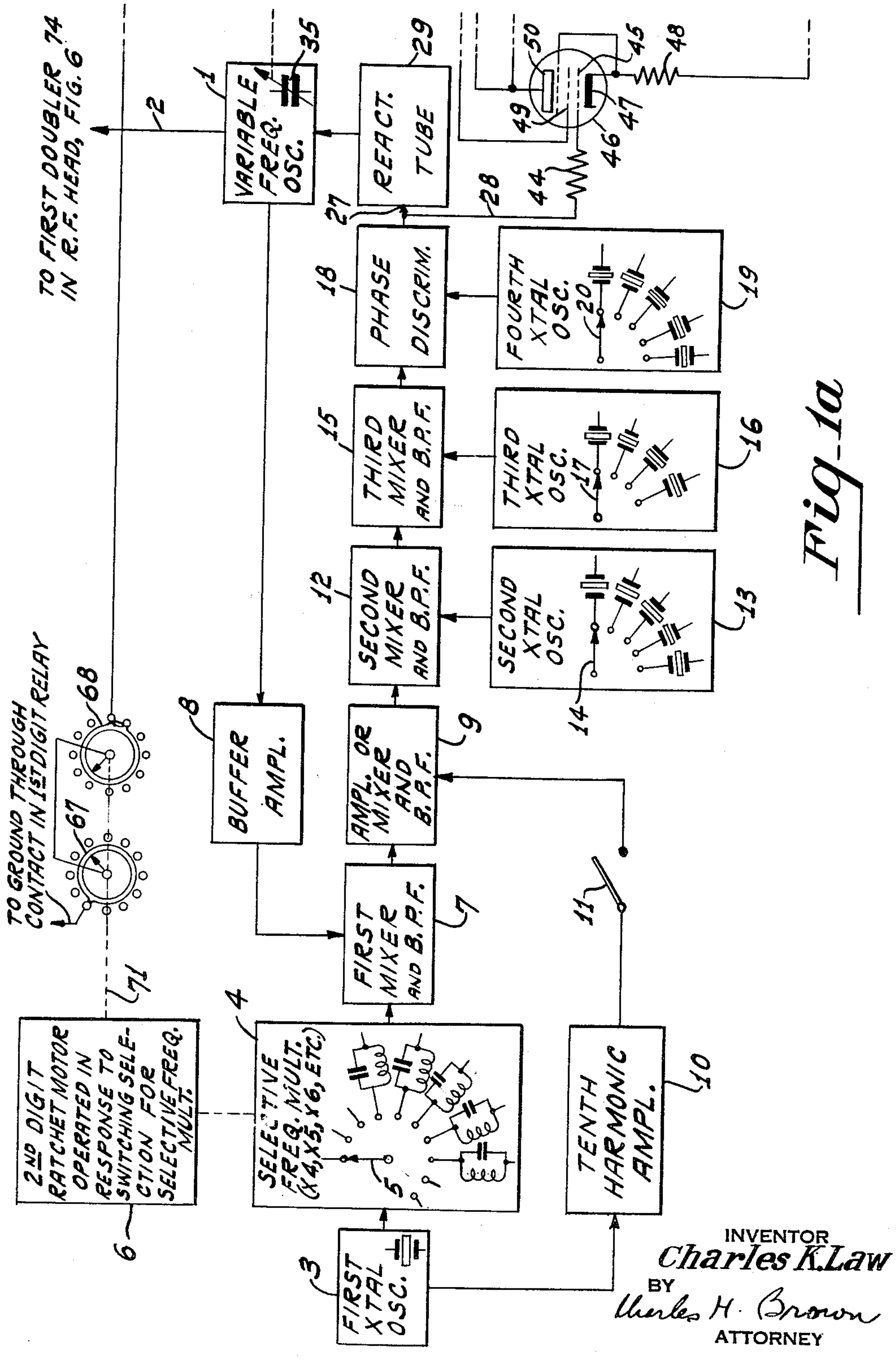

First referring to Fig. 1, a variable frequency oscillator 1 is the master oscillator of the transmitter-receiver, which oscillator is to be automatically tuned and the frequency of which is to be stabilized by the system of this invention. Oscillator 1 is used for heterodyning purposes in the transmitter and the receiver of a transmitter-receiver with which this invention may be used; by means of a schematically-illustrated connection 2, oscillatory energy is taken from oscillator 1 for application to units in the RF head of the equipment, later referred to in connection with Fig. 6. The remainder of Fig. 1 with the exception of the reactance tube 29 and the tuning motor 31 may be termed a "monitor" and is essentially an automatic frequency control system whose function is to compare two frequencies (one of which is representative of the frequency of oscillator 1) and then to change one of them (the frequency of oscillator 1) until the representative frequency becomes the same as the other frequency being compared.

A first crystal oscillator 3, having a predetermined constant and fixed frequency, for example 0.833333 mc., feeds oscillatory energy of this frequency into a selective frequency multiplier 4, in which any one of ten harmonics (for example, any one of the fourth through thirteenth harmonics) of oscillator 3 may be selected by means of a switching arrangement indicated somewhat schematically at 5. Switch 5 may be operated by a second digit ratchet motor 6 (which, in turn, may be operated from a remote point by means of a bridge-type selective switching arrangement) to select and couple into multiplier 4 any selected one of ten resonant circuits (only five of which are shown) tuned respectively to the fourth through thirteenth harmonics of oscillator 3. In this way, any selected harmonic of oscillator 3, from the fourth through the thirteenth, may be caused to appear at the output of multiplier 4. Let us assume that the fourth harmonic is selected; this harmonic would have a frequency of 3.333333 mc.

The output of multiplier 4 is fed into the first mixer and bandpass filter 7. Also fed into mixer 7 is a sample frequency from the controlled oscillator 1, this frequency being fed into such mixer through a buffer amplifier 8. In mixer 7, the frequencies derived from oscillator 1 and from multiplier 4 are mixed and either the sum or the difference of these two frequencies is selected by the bandpass filter portion of 7. Let us assume that it is the difference frequency that is selected. Throughout the monitor of this invention, the difference frequencies are selected from the various mixers. Then, since oscillator 1 has a frequency of 23.681250 mc., for example (how it can be tuned to and held at this frequency will become apparent hereinafter), the frequency of the output of 7 will be 20.347917 mc.

The output of unit 7 is fed to a unit 9, which is an amplifier or mixer and a bandpass filter. An amplifier 10 receives oscillatory energy from oscillator 3 and amplifies the tenth harmonic of this energy. When the switch 11 is closed, this tenth-harmonic energy (which may have a frequency of 8.333333 mc., for example) is fed to unit 9, which under these conditions acts or functions as a mixer and bandpass filter for mixing the tenth-harmonic frequency of oscillator 3 and the output of unit 7 and for selecting the difference of these two mixed frequencies. Use of the amplifier 10 effectively extends the number of harmonics of oscillator 3 that can be selected, to twenty. When switch 11 is open, the tenth harmonic amplifier 10 is in effect not used and unit 9 then functions or acts only as an amplifier, amplifying the output of 7 and passing such amplified output on to the second mixer and bandpass filter 12. Let us assume that switch 11 is closed and amplifier 10 is being used, the unit 9 then functioning as a mixer and bandpass filter to select the difference between the two applied frequencies (which in our example are the tenth-harmonic frequency of 8.333333 mc. and the 20.347917-mc. output of mixer 7). Then, the frequency in the output of unit 9 will be a difference frequency of 12.014583 mc. (to the nearest cycle).

The output of unit 9 is fed as one of the inputs to the second mixer and bandpass filter 12. A second crystal oscillator 13 feeds a predetermined, preset frequency as the other input to unit 12. In oscillator 13, any one of five different frequencies may be selected by means of a switching arrangement indicated somewhat schematically at 14. Switch 14 may be operated by the third and fourth digit ratchet motors (not shown, but which in turn may be operated from a remote point by means of a bridge-type selective switching arrangement) to select and couple to the oscillator 13 any selected one of five crystals each having a different resonant frequency, so that the frequency of oscillator 13 is governed by the particular crystal selected. The five different crystal frequencies, and therefore the five different frequencies of oscillator 13, any one of which may be selected, are: 3.233333 mc., 3.400000 mc., 3.566667 mc., 3.733333 mc. and 3.900000 mc. Let us assume that the first or lowest frequency crystal is selected by 14, so that oscillator 13 is operating at 3.233333 mc. Then, since the difference frequency is selected in mixer 12, the frequency of the output of this mixer will be 8.781250 mc.

The output of unit 12 is fed as one of the inputs to the third mixer and bandpass filter 15. A third crystal oscillator 16 feeds a predetermined, preset frequency as the other input to unit 15. In oscillator 16, any one of four different frequencies may be selected by means of a switching arrangement indicated somewhat schematically at 17. Switch 17 may be operated by the aforementioned third and fourth digit ratchet motors to select and couple to the oscillator 16 any selected one of four crystals each having a different resonant frequency, so that the frequency of oscillator 16 is governed by the particular crystal selected. The four different crystal frequencies, and therefore the four different frequencies of oscillator 16, any one of which may be selected, are: 3.650000 mc., 3.691667 mc., 3.733333 mc. and 3.775000 mc. Let us assume that the first or lowest frequency crystal is selected by 17, so that oscillator 16 is operating at 3.650000 mc. Then, since the difference frequency is selected in mixer 15, the frequency of the output of this mixer will be 5.131250 mc.

The output of unit 15 is fed as one of the inputs to a phase discriminator 18 in which the frequency and/or phase of such output is compared with that of oscillatory energy from a fourth crystal oscillator 19. The basic operation of the monitor of this invention would be unchanged if the variable frequency master oscillator 1 sample output were fed directly into the discriminator 18 and there compared with any one of 1750 crystal frequencies, rather than being fed through the cascaded mixers 7, 9, 12, etc. The portion of the monitor so far described, therefore, is a crystal saving circuit, since only fifteen crystals are required instead of 1750. At any rate, by means of the cascaded mixers, a frequency representative of the variable frequency master oscillator frequency is fed into discriminator 18.

Oscillator 19 feeds a predetermined, preset frequency as the other input to discriminator 18. In oscillator 19, any one of five different frequencies may be selected by means of a switching arrangement indicated somewhat schematically at 20. Switch 20 may be operated by the aforementioned third and fourth digit ratchet motors to select and couple to the oscillator 19 any selected one of five crystals each having a different resonant frequency, so that the frequency of oscillator 19 is governed by the particular crystal selected. The five different crystal frequencies, and therefore the five different frequencies of oscillator 19, any one of which may be selected, are: 5.131250 mc., 5.139583 mc., 5.147917 mc., 5.156250 mc. and 5.164583 mc. Let us assume that the first or lowest frequency crystal is selected by 20, so that oscillator 19 is operating at 5.131250 mc. This latter frequency is the same as that appearing in our example at the output of mixer 15, so that a balanced condition exists in the discriminator 18 and the variable frequency master oscillator 1 is tuned to the proper selected frequency.

Figure 6:
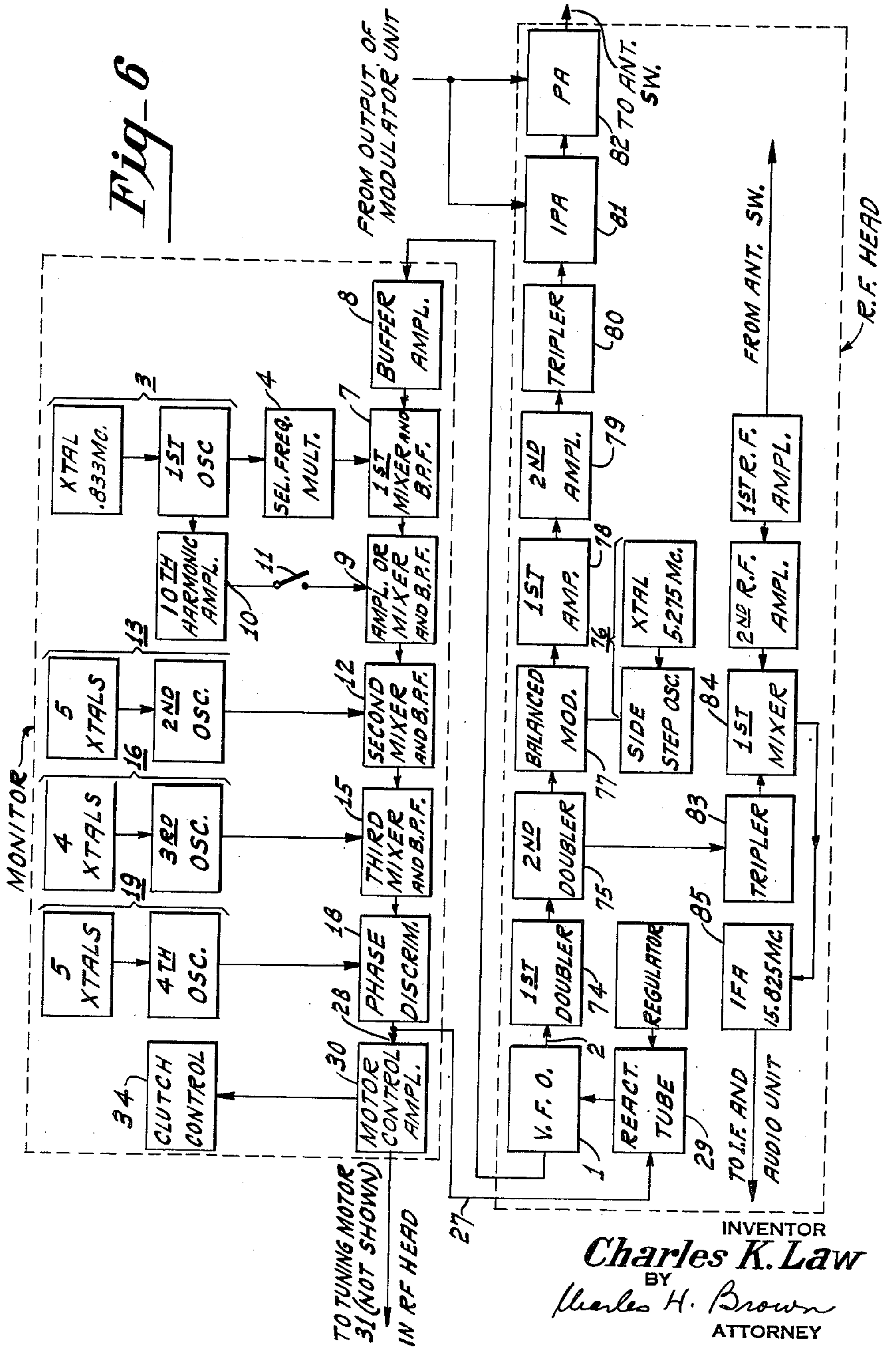
Fig. 6 is a block diagram of the major portion of a transmitter-receiver utilizing this invention.

Now referring for the moment to Fig. 6, which is a block diagram of the major portion of a transmitter-receiver utilizing this invention, the units previously described constitute the "Monitor" of the transmitter-receiver and appear inside the dotted rectangle labeled correspondingly. The further units to now be described constitute the "RF head" of the transmitter-receiver, and appear inside the dotted rectangle labeled correspondingly. The major portion of the output of variable frequency master oscillator 1 is passed through the first and second cascaded frequency doublers 74 and 75 and then, for the transmitter part of the transmitter-receiver, is mixed with a crystal oscillator frequency of 5.275000 mc., derived from the side step oscillator 76, in a balanced modulator 77. The sum frequency is selected from this balanced modulator, amplified by the first and second amplifiers 78 and 79, tripled in frequency in tripler 80, modulated in the intermediate power amplifier 81 and the power amplifier 82 by the output of a modulator unit (not shown), and fed to the antenna switch for transmission from the antenna. In the example given, with a VFO or MO frequency of 23.681250 mc., the frequency at the output of doubler 75 would be 94.725000 mc., the frequency at the input of amplifier 78 would be 100.000000 mc., and the frequency at the output of tripler 80 (that fed to the transmitting antenna) would be 300.000000 mc.

The master oscillator 1 is also used in the receiving portion of the transmitter-receiver. For this purpose, the output of doubler 75 is tripled in tripler 83 and fed to the first (receiving) mixer 84, where it is used to beat or heterodyne with amplified radio frequency energy which is received via the antenna when the antenna switch is properly thrown. The output of mixer 84 is fed to the IF amplifier 85 from whence it goes to the IF and audio unit (not shown) of the transmitter-receiver.

The VFMO 1, according to a typical embodiment of this invention, must be tuned from a frequency of 17.431250 mc. (corresponding to a frequency of 225 mc. at the antenna) to a frequency of 32.006250 mc. (corresponding to a frequency of 399.9 mc. at the antenna). Because of this large required tuning range of oscillator 1, a reactance tube tuning control system alone is not sufficient. The tuning cycle must be accomplished in two steps, the first utilizing a motor drive to rotate the ganged oscillator tuning capacitors until the tuning is nearly correct, and the second utilizing a reactance tube to provide the fine tuning control.

Figures 1B, 2, 3, 4, 5:
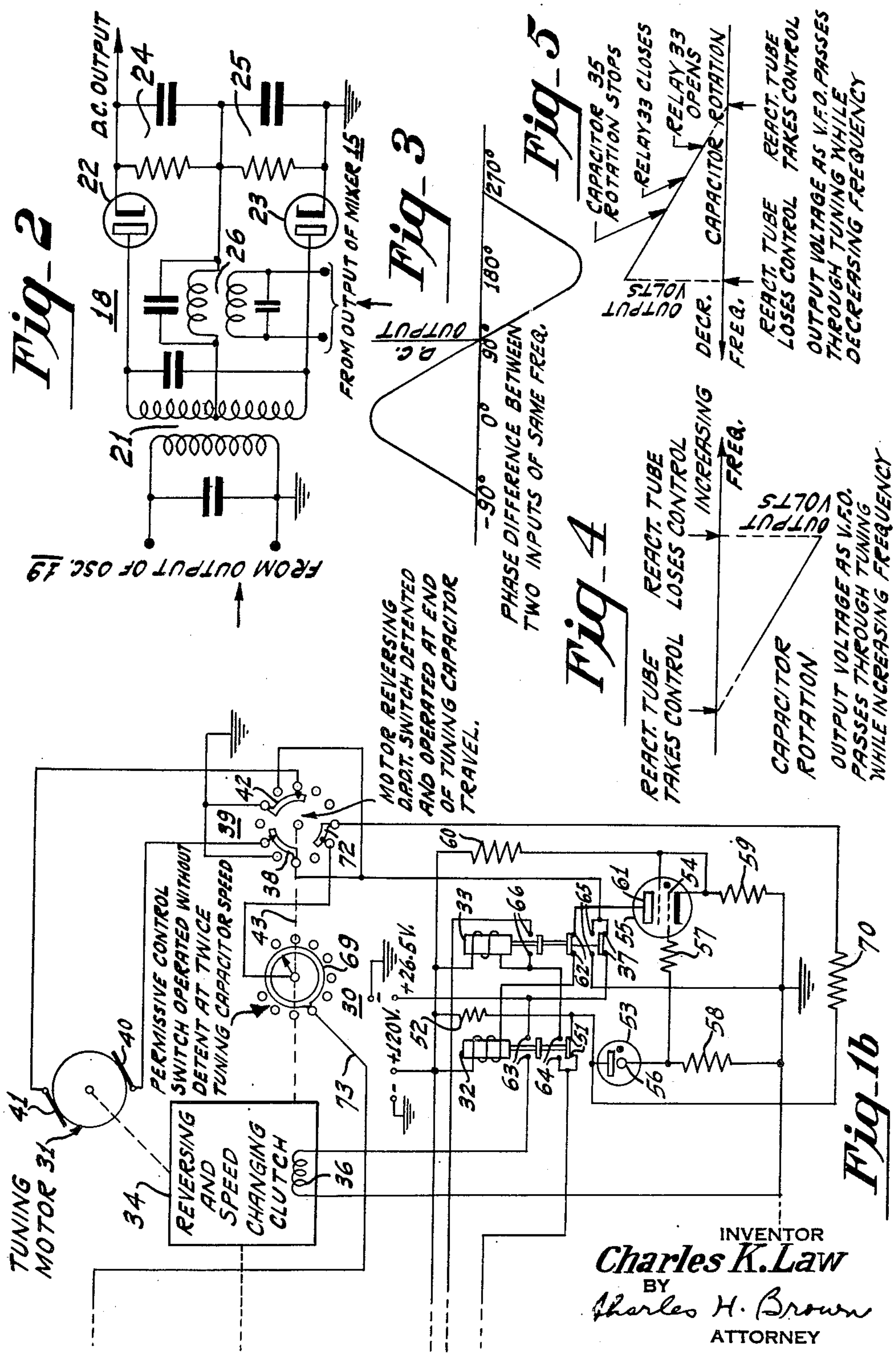
Fig. 2 is a detail of a portion of Fig. 1.
Figs. 3–5 are discriminator characteristic curves useful in explaining the invention.

Fig. 2 is a rather detailed circuit illustration of the phase discriminator 18. This discriminator, generally speaking, is rather similar to the conjugate-input phase detector circuit described in the Pomeroy Patent #2,288,-025, dated June 30, 1942. The output of the fourth crystal oscillator 19 is applied between the two opposite ends of the tuned primary winding of one input transformer 21, opposite ends of the tuned secondary winding of this transformer being connected to separate anodes of two diodes 22 and 23. These two tuned circuits are band-pass-tuned, centered at the center frequency, approximately 5.14 mc., of the required tuning range. Thus, this wave from oscilaltor 19 is applied antiphasally to the two anodes. A pair of series-arranged parallel RC load circuits 24 and 25 are connected between the cathode of diode 22 and ground or the cathode of diode 23. The output of mixer 15 is applied between the two opposite ends of the tuned primary winding of another input transformer 26, one end of the tuned secondary winding of this transformer being connected to the midpoint of the secondary of transformer 21 and the opposite end of the secondary of transformer 26 being connected to the common junction point of load circuits 24 and 25. These two last-named tuned circuits are tuned similarly to the tuned primary and secondary windings of transformer 21.

Two different voltages are effective in producing an output from the phase discriminator 18, the push-pull signal (derived from oscillator 19) and the push-pull signal (derived from mixer 15). The frequencies of the two inputs may not be the same. We will now consider the action of discriminator 18 of Fig. 2 under two different conditions, first when the two input frequencies are not the same and second when the two frequencies are the same.

When the input frequencies are not the same, the circuit of Fig. 2 operates only as a mixer and the direct current output (which is taken off from the cathode of diode 22) is zero.

If the two input frequencies are the same, the circuit of Fig. 2 operates as a phase discriminator and as the phase difference between these input signals changes the direct current discriminator output also changes. As the phase relation between the two input signals of the same frequency changes, the familiar S-shaped curve of direct current discriminator output is produced; this curve is shown in Fig. 3.

The output of phase discriminator 18 in Fig. 1 is applied to two separate items by means of respective couplings 27 and 28. A reactance tube 29 in the RF head of the transmitter-receiver is coupled to the variable frequency master oscillator 1 in such a way as to serve as an electronic variable frequency-controlling reactance (either capacitive or inductive) therefor and is in turn supplied with phase discriminator output via coupling 27. As the output of discriminator 18 varies, the frequency of oscillator 1 is caused to vary accordingly by means of reactance tube 29. The coupling 28 supplies phase discriminator output to a relay circuit indicated generally at 30, which circuit controls a tuning motor 31 in a manner to be fully described hereinafter. Motor 31 is in the RF head of the transmitter-receiver and mechanically rotates a variable capacitor 35 in the frequency-determining circuit of oscillator 1, through a clutch arrangement 34, to vary the frequency of such oscillator in dependence upon the motor rotation.

Another factor now enters into the operation of the discriminator 18 as it is used in the frequency control system of Fig. 1. Practically speaking, the two input frequencies to discriminator 18 are never exactly the same unless the reactance tube 29 is controlling the frequency of the oscillator 1. It will be recalled that the direct current output of the discriminator 18 is zero when the input frequencies are not the same, and has the characteristic illustrated in Fig. 3 when the input frequencies are the same. The reactance tube 29 has a limited range of control, with the effect that the curve of discriminator output versus variable frequency oscillator tuning becomes discontinuous as the reactance tube loses control of oscillator 1. Also, since the discriminator 18, being a phase discriminator as contrasted to a frequency discriminator, can furnish no direct current output until the two input frequencies thereof are the same, the tuning system of this invention provides no pull-in range and the tuning of the oscillator must actually be carried through the correct tuning point before a discriminator output is realized.

Figs. 4 and 5 represent the output of the phase discriminator 18 for the two different motor tuning conditions. In Fig. 4, the output voltage of the discriminator is plotted against oscillator tuning capacitor rotation or against time, as the variable frequency oscillator passes through the correct tuning point while it is being increased in frequency by the action of the tuning motor. If the variable frequency oscillator frequency passes through the correct frequency or tuning point while going toward the high frequency end of the capacitor travel, the reactance tube 29 takes control of the oscillator 1 at the correct tuning point. Since the variable frequency oscillator is now being held at the correct frequency by the reactance tube, the two inputs to the phase discriminator have the same frequency and the Fig. 3 discriminator output characteristic comes into play. The reactance tube holds control of the variable frequency oscillator until the (mechanical) tuning thereof reaches the reactance tube hold-in limit. At this point, where the reactance tube loses control, the oscillator frequency suddenly changes from the correct value to another frequency determined by the mechanical tuning of the variable frequency oscillator. At this point, since the two input frequencies to the phase discriminator then become different, the direct current output of the discriminator suddenly drops to zero. Fig. 4 accordingly represents the discriminator output voltage as the variable frequency oscillator passes through the correct tuning point while the oscillator is being increased in frequency by the rotation of the tuning capacitor. The voltage represented by the toothed waveform of Fig. 4 is a negative pulse and has the definite form of a pulse when viewed with suitable test equipment. According to this invention, as will become apparent hereinafter, the pulse of Fig. 4 is derived as the capacitor is moving at high speed. The length of the Fig. 4 pulse may for example be about one milli-second, with a peak amplitude of about six volts negative.

In Fig. 5, the output voltage of the discriminator is plotted against oscillator tuning capacitor rotation, or against time, as the variable frequency oscillator passes through the correct tuning point while it is being decreased in frequency by the action of the tuning motor. If the variable frequency oscillator frequency passes through the correct frequency or tuning point while going toward the low frequency end of the capacitor travel, the reactance tube takes control of the oscillator at the correct tuning point. Again, the Fig. 3 discriminator output characteristic comes into play. A similar phenomenon occurs, the oscillator frequency suddenly changing at the point where the reactance tube loses control, at which point the oscillator frequency suddenly changes from the correct value to another frequency determined by the mechanical tuning of the variable frequency oscillator. The direct current output of the phase discriminator at this point where the reactance tube loses control, suddenly drops to zero. The voltage represented by the toothed waveform of Fig. 5 is a positive pulse and has the definite form of a pulse when viewed with suitable test equipment. Fig. 5 represents the discriminator output voltage as the variable frequency oscillator passes through the correct tuning point while the oscillator is being decreased in frequency by the rotation of the tuning capacitor. The meaning of the notations in Fig. 5, "relay 33 opens," "relay 33 closes," and "capacitor 35 rotation stops," will become clearer as the description proceeds.

The operation of the motor control system of this invention may best be explained by following through one tuning cycle. Assume the transmitter-receiver is intially tuned up and that when the crystals and selective circuits and switches in units 4, 11, 13, 16 and 19 are changed to tune the master oscillator 1 of the transmitter-receiver to a lower frequency. Assume also that the two relays 32 and 33 of unit 30 are deenergized and have the positions illustrated. How these latter relay positions are brought about will be explained hereinafter.

A two-position reversing and speed changing clutch is schematically indicated at 34; this clutch mechanically couples the shaft of tuning motor 31 to the tuning capacitor 35 of oscillator 1. The energizing coil for this clutch is indicated at 36. In the normally unenergized position illustrated this clutch causes the motor 31, when such motor is energized, to drive the capacitor 35 at high speed in one direction. When winding 36 of this clutch is energized, it has a reversing and speed changing effect, so that when the clutch is energized the capacitor 35 is driven by motor 31 at slow speed in the other direction.

Assume that relay 33 is deenergized, which deenergization will take place when the crystals are selected to tune to another lower frequency, after the transmitter-receiver oscillator is initially tuned up. Then, an energizing circuit is completed for motor 31, as follows: Positive terminal of 26.5-volt unidirectional source, closed contacts 37 of relay 33, wafer 38 of the double-pole double-throw wafer switch 39, lower brush 40 of motor 31, upper brush 41 of motor 31, wafer 42 of switch 39, ground. Motor brush 41 is now grounded, and positive voltage is applied to motor brush 40. The negative terminal of the 26.5-volt source is connected to ground. Motor 31 therefore drives the capacitor 35 at high speed (clutch 34 being unenergized) to the high frequency end of its travel.

Since we are assuming that the transmitter-receiver is being tuned to another lower frequency, the output voltage curve of Fig. 4 will not come into play during this initial travel of the capacitor to its high frequency end; it will be remembered that the curves of Figs. 4 and 5 come into play only when the correct tuning point is passed.

Wafer switch 39 is detented on a shaft 43 driven by motor 31 and is operated by a "dog" at the ends of the tuning capacitor travel. When the tuning capacitor reaches the high frequency end of its travel, switch 39 is operated to its other position (one position clockwise from that illustrated) to apply positive voltage to brush 41 and ground to brush 40. The connections to the motor 31 are now reversed and the capacitor 35 is driven at high speed (clutch 34 still being unenergized) to the low frequency end of its travel.

The lead 28 from the output of phase discriminator 18 is connected through a resistor 44 to the control grid 45 of a pentode vacuum tube 46, which may be of the 973C type. This tube is operated as a class A amplifier, its cathode 47 being connected to ground through a resistor 48 and its screen grid 49 being connected to the positive terminal of a unidirectional potential source, of 120 volts, for example. Anode 50 of tube 46 is connected to the 120-volt positive terminal through the closed contacts 51 of relay 32 and a resistor 52.

As the tuning passes through the proper tuning point, the capacitor being driven toward the low frequency end of its travel, the discriminator 18 has an output as shown in Fig. 5, due to the taking of control, by the reactance tube, of the variable frequency oscillator when the frequency thereof passes through the proper tuning point. This saw-tooth waveform of Fig. 5 can be considered a pulse of voltage, it being a positive pulse. This positive pulse is applied to grid 45, producing a negative pulse or a drop in voltage at the anode 50. The anode of a gaseous diode 53, for example a type NE-2 tube, is connected to the anode resistor 52 of tube 46. This drop in voltage at anode 50 has no appreciable effect on tube 53, since it is of the wrong polarity to fire this tube.

When the capacitor 35 reaches the low frequency end of its travel, switch 39 is returned to the position illustrated, again reversing the connections to motor 31 and causing the capacitor 35 to be driven by motor 31 toward the high frequency end of its travel at high speed. As the tuning passes through the proper tuning point, while proceeding in the direction of increasing frequency, the reactance tube takes control of the variable frequency oscillator as its frequency is swept rapidly through the proper tuning point, and the discriminator 18 has a direct current output as illustrated in Fig. 4. Since the tuning is taking place at high speed, this output has a duration of only a few milli-seconds and may be considered to be a negative voltage pulse.

This negative pulse appears at the grid 45. It will be recalled that tube 46 is operated as a class A amplifier, so a positive voltage pulse appears at anode 50. The anode voltage rises above 80 volts, the firing potential of tube 53, causing this tube to conduct, since it is connected to the anode 50 through closed contacts 51.

The control grid 54 of a thyratron gaseous discharge device 55, for example of the 949C type, is connected to cathode 56 of diode 53 through a resistor 57. Cathode 56 is grounded through a resistor 58, while the cathode of thyratron 55 is grounded through a resistor 59. The thyratron cathode is connected to the positive 120-volt terminal through a voltage dividing resistor 60. The anode 61 of thyratron 55 is connected through the normally-closed contacts 62 of relay 33 and through the energizing winding of relay 32 to the positive 120-volt terminal, so that conduction or the flow of anode current in thyratron 55 energizes relay 32.

The thyratron 55 is used as an electronic relay, while diode 53 is used as a threshold device, to keep noise in the system from triggering the thyratron. When the NE-2 tube 53 fires, a positive voltage pulse appears at the thyratron grid 54, causing thyratron 55 to conduct.

The thyratron anode current energizes relay 32, closing such relay. It will be recalled that the motor-operated tuning of the oscillator is proceeding at high speed in the direction of increasing frequency, when thyratron 55 is fired in response to the negative voltage pulse which appears at the output of discriminator 18 as the tuning passes through the proper tuning point. In effect, this negative voltage pulse is amplified by the motor control direct current amplifier 46, inverted in phase and the positive voltage pulse appearing at anode 50 is used to ionize thyratron 55, causing it to conduct to energize relay 32.

Energization of relay 32 completes an energization circuit for coil 36 of clutch 34, as follows: Positive terminal of 26.5-volt source, the normally-open (but now closed) contacts 63 of relay 32, coil 36, ground. This energizes clutch 34, causing the direction of rotation of capacitor 35 by motor 31 to be reversed and the speed of rotation of the capacitor to be reduced. Motor 31 then drives the capacitor 35 at slow speed in the other direction. Thus, the oscillator tuning capacitor 35 will then be driven at slow speed toward the low frequency end of its travel, which is again toward the correct tuning point.

When relay 32 is energized in the foregoing manner, contacts 51 thereof are opened to remove resistor 52 from the anode circuit of pentode 46 and the normally-open contacts 64 of this relay are closed to connect the energizing winding of relay 33 into the anode circuit of the pentode, between pentode anode 50 and the positive 120-volt terminal. The opening of contacts 51 and the removing of resistor 52 from the anode circuit of tube 46, removes the firing potential from diode 53 and extinguishes this diode.

To summarize the circuit conditions existing after thyratron 55 is fired, relay 32 is energized, relay 33 is unenergized, the tuning motor 31 is running at full speed, but the clutch 34 is energized to cause capacitor 35 to be driven at slow speed toward the low frequency end. Relay 33 is connected into the anode circuit of pentode 46.

Tuning proceeds at slow speed toward the low frequency end (toward the correct tuning point) until the correct tuning point is again reached, at which time the output characteristic of Fig. 5 becomes effective or comes into play.

As the discriminator output voltage rises or increases as represented by the toothed waveform of Fig. 5, this positive voltage applied to grid 45 of tube 46, as the reactance tube obtains control of the variable frequency oscillator, causes the anode current of tube 46 to increase. When the applied voltage on grid 45 reaches a certain pre-determined magnitude, the anode current of tube 46 becomes sufficient, at some value of current as illustrated in Fig. 5 (see notation "relay 33 closes" in Fig. 5), to energize relay 33, causing it to close.

Energization of relay 33 opens its contacts 37 to disconnect tuning motor 31 from the 26.5-volt supply. At the same time, the normally-open contacts 65 of relay 33 are closed to connect the lower brush 40 of motor 31 to ground through an obvious circuit (it will be recalled that switch 39 is now in the position illustrated). Since the upper brush 41 of the motor is already grounded, this means that the motor brushes 40 and 41 are shorted together when relay 33 is energized; this short-circuiting of the brushes stops the motor 31 quickly at the time or capacitor rotation indicated in Fig. 5 (see notation "capacitor 35 rotation stops" in Fig. 5).

Energization of relay 33 closes its normally-open contacts 66 to establish a cricuit from anode 50 through such contacts and the winding of relay 33 to the 120-volt source, so that tube 46 will not lose control of relay 33 when relay 32 opens.

Energization of relay 33 opens its contacts 62 to break the circuit between thyratron anode 61 and the 120-volt source. This extinguishes thyratron 55 and also deenergizes relay 32, the winding of which is in series in the thyratron anode circuit. Relay 32 is of the slow release type, to make certain that the circuit from anode 50 to the winding of relay 33 through contacts 66 of relay 33 is established before relay 32 releases.

Release of relay 32 deenergizes the coil 36 of clutch 34 by opening contacts 63 and resets the connections to anode 50 by closing contacts 51.

The tuning cycle is now complete and the system has been reset to permit another tuning cycle. To summarize the circuit conditions existing after the tuning is completed, relay 33 is energized, relay 32 is deenergized, thyratron 55 is non-conducting, the tuning motor 31 is deenergized and its brushes shorted together, and clutch 34 is deenergized so that it is in its high speed forward position.

It was assumed that at the start of the tuning cycle, relays 32 and 33 were both deenergized, and as a matter of fact relay 33 must be open or deenergized at the start of a new tuning cycle in order to complete an energization circuit for tuning motor 31. When any one or more of the various crystals or tuned circuits is selected in order to tune oscillator 1 to another frequency, the frequency of at least one of the inputs to discriminator 18 will change, tending to cause the discriminator output to decrease toward zero or to go to zero at the limit of the reactance tube hold-in range, depending upon whether the new frequency selected is higher or lower, respectively, than the frequency to which oscillator 1 has previously been brought. Assuming that the new frequency selected is higher than the previous frequency of oscillator 1, then when the discriminator output falls to the point indicated in Fig. 5 by the legend "relay 33 opens," the discriminator output voltage applied to grid 45 has a reduced value which results in a value of anode current in tube 46 that is insufficient to maintain relay 33 energized. Relay 33 is then deenergized to remove the short circuit on the motor brushes (by opening of contacts 65), to energize the motor 31 (by closing of contacts 37) and to complete the anode circuit to thyratron 55 (by closing of contacts 62). Assuming that the new frequency selected is lower than the previous frequency of oscillator 1, then at the low-frequency limit of the reactance tube hold-in range (see "reactance tube loses control" in Fig. 5), the discriminator output voltage suddenly drops to zero and the tube 46 anode current is again insufficient to maintain relay 33 energized. Such relay is therefore deenergized, to energize motor 31.

It will be appreciated that the final slow tuning action, in which the clutch 34 is employed, is entirely separate from the searching or cycling control employing the reversing switch 39. In the cycling control, the direction of rotation of the motor is reversed, while in the final slow tuning the motor itself is not reversed. The operation of the system of this invention is independent of the means 39 used to reverse the motor at the ends of the tuning capacitor travel. In fact, the motor-reversing circuits necessary for the searching part of the tuning cycle could be dispensed with if it were possible to mechanically rotate all the ganged tuning capacitor shafts through 360°.

Now assume that the transmitter-receiver is initially tuned up and then the proper crystals are selected to tune to another higher frequency. Selection of the crystals causes immediate deenergization of relay 33, as above described. The motor 31 is energized and drives capacitor 35 at high speed toward the high frequency end (switch 39 being in the position illustrated and clutch 34 being unenergized) until it passes the correct tuning point. As the tuning passes through the proper tuning point, the negative pulse of Fig. 4 appears at the output of the discriminator, firing tubes 53 and 55 and closing relay 32. Clutch 34 is then energized to cause the motor 31 to drive capacitor 35 at slow speed toward the low frequency end. Tuning proceeds toward the low frequency end at slow speed until the correct tuning point is again reached, at which time the output characteristic of Fig. 5 becomes effective. As the positive discriminator output voltage rises, a value of anode current is reached in tube 46 at which relay 33 is energized, disconnecting tuning motor 31, short-circuiting its brushes, and disconnecting the thyratron anode circuit from the positive voltage source to extinguish the thyratron and deenergize or open relay 32. Thus, the tuning cycle is completed and the system is reset to permit another tuning cycle.

Normally, small variations or drifts in frequency of oscillator 1, from the predetermined preset frequency, are automatically corrected by the phase discriminator-reactance tube control loop in a more or less conventional manner—that is, drifts in frequency of oscillator 1 from the predetermined frequency result in corresponding outputs from discriminator 18 and these discriminator outputs are applied through connection 27 to reactance tube 29 to return the frequency of oscillator 1 to the correct value. It is not desirable for the variable frequency oscillator to drift excessively and every precaution is taken to prevent this from occuring. However, the motor control system of this invention will quickly retune the oscillator 1 if it does drift excessively. Under the conditions with which we are concerned, the master oscillator frequency does not change as drifting occurs. The oscillator frequency would change if it were not being controlled, but it is under the control of the reactance tube and the monitor with its phase discriminator, so the oscillator 1 is not a free agent in this matter. Therefore, as long as the reactance tube 29 has control of the oscillator 1 (as long as any voltage is developed by the discriminator 18) the master oscillator frequency is correct; the only change is in phase. We will now consider separately the retuning action for each of the two possible directions of excessive drift.

First, assume that the master oscillator 1 is tending or trying to drift excessively in the direction of increasing frequency. The frequency does not actually rise or increase; the oscillator only tries to drift in this direction and the reactance tube 29 keeps it on frequency. Refer to the discriminator output characteristic of Fig. 5 (it will be recalled that at the conclusion of each tuning cycle this particular characteristic is effective). A tendency to drift in the direction of increasing frequency (toward the right in Fig. 5) lowers or makes less positive the direct voltage output of the discriminator, which in turn lowers the anode current of pentode 46, since the direct voltage discriminator output is applied to grid 45 of this pentode. As the oscillator frequency tends to drift excessively, beyond a certain predetermined value, the pentode anode current drops to a level insufficient to maintain relay 33 energized and this relay opens or releases. It will be recalled that at the end of the preceding tuning cycle, relay 33 is left energized, thereby connecting its coil as an anode load for tube 46.

When relay 33 is deenergized to open or release the same, its contacts 65 open and its contacts 37 close, to remove the short-circuit from the motor brushes 40, 41 and to connect the 26.5-volt supply to the motor 31. Since clutch 34 has previously been deenergized as the final step of the preceding tuning sequence or cycle, the capacitor 35 is driven at high speed toward the high frequency end, when the motor 31 begins to run.

It should be noted at this point that the motor control circuit has come into operation (thereby energizing the motor) without the reactance tube ever losing control of the oscillator, so that the oscillator 1 is still on the correct frequency and the direct voltage discriminator output is still changing. Therefore, as the capacitor 35 moves toward the high frequency end, the discriminator output becomes less and less positive, passes through zero, and becomes negative. This negative voltage acts through the direct current amplifier 46 to trigger the thyratron 55 as in the initial tuning cycle of action and the remainder of the tuning proceeds as previously described. In actual operation, this whole sequence takes about 0.6 second under normal conditions, and the complete tuning correction usually takes place without the frequency of the master oscillator once departing from the correct value.

Now assume that the master oscillator 1 is tending or trying to drift excessively in the direction of decreasing frequency. Again refer to Fig. 5. A tendency to drift in the direction of decreasing frequency (toward the left in Fig. 5) raises or makes more positive the direct voltage output of the discriminator, until the limit of the hold-in range of the reactance tube is reached, at which time the discriminator output drops sharply to zero (see Fig. 5). When this occurs, relay 33 again is deenergized because it is biased to open when the voltage on grid 45 drops below some positive value, and now the grid voltage has dropped to zero. The motor 31 again drives the capacitor 35 at high speed toward the high frequency end until it passes the correct tuning point, at which time the negative discriminator voltage output illustrated in Fig. 4 appears. This provides a negative voltage pulse which again acts through the direct current amplifier 46 to trigger the thyratron 55 as in the initial tuning cycle of action and the remainder of the tuning proceeds as previously described. In actual operation, this tuning sequence, the retuning for variations or drift in the direction of decreasing frequency, takes about 0.8 second. It will be appreciated that, for both of the possible directions of excessive drift, the negative voltage necessary to trigger the thyratron 55 appears in the discriminator output almost immediately after the motor 31 begins to drive the capacitor 35 at high speed toward the high frequency end.

It is to be noted, from the foregoing description, that the fact that a single pulse of voltage is obtained at the output of the phase discriminator in my system as the frequency is swept quite rapidly through the proper tuning point, is used to great advantage. This pulse of voltage, which appears only after the proper tuning point is passed, is used in my system to operate a single clutch which reverses the direction of tuning and also changes the speed of tuning.

According to this invention, a single relay 33 is used to deenergize the motor control system as tuning is completed. In this system, use is made of the fact that a reactance tube in a system such as this reaches a point, as larger signals are applied to it, where it can no longer respond to the applied signal; it then loses control. When this happens, the control loop (similar to a feedback circuit) is broken and the direct current output of the phase discriminator drops to zero. The net effect on the relay circuit is thus the same for any drift which causes the phase discriminator output to either increase or decrease beyond certain limits. Because of this effect, one relay may be used in place of two or more, while yet allowing the system to be self-correcting when excessive drift arises.

The time taken for one complete tuning cycle is a function of the speed of rotation of the oscillator tuning capacitor. With the clutch 34 deenergized (its high speed forward position) the capacitor can easily be driven at the rate of approximately one complete revolution every two seconds. Thus, the maximum time spent in high speed drive will be two seconds. The speed of rotation when the clutch is energized (low speed reverse position) is many times slower than in the high speed position. However, because the tuning is very close to the proper point before the slow speed is used, the final tuning takes only one to two seconds. The complete tuning cycle, then, takes a maximum of four seconds.

Retuning for slow variations in the circuit, such as drift of the variable frequency master oscillator, will take only one to two seconds or even less.

There may be a possibility of false discriminator responses at points removed from the correct tuning point. This makes it desirable to provide a circuit which will permit tuning only over a restricted range of oscillator tuning capacitor positions. Such a circuit is herein called a "permissive circuit" and is illustrated in Fig. 1 in one of its forms.

Use is made of a combination of two switch wafers 67 and 68 on the ratchet motor shafts 71 of ratchet motor 6 and one wafer 69 on the tuning capacitor shaft 43. One end of a resistor 70 is connected to the anode of diode 53 and the other end of said resistor is connected through a wafer 72 of switch 39 and through wafer 69 to a lead 73 which goes to wafer 68. The main contacts of wafers 68 and 67 are connected together and one of the fixed contacts associated with wafer 67 goes to ground through a contact of the first digit relay (not shown). Thus, with all of the switch wafers in the positions illustrated, the resistor 70 in the circuit of NE-2 tube 53 is grounded. With the proper arrangement of circuit connections to the switch wafers, resistor 70 may be grounded in this manner over all but the desired tuning range. If this resistor is grounded, tube 53 cannot fire and the relay circuit 30 is disabled. This prevents false tuning on any responses outside the permissive range.

In Fig. 1, the permissive circuit just described is illustrated as effecting a connection of resistor 70 to ground. It is desired to be pointed out, however, that this has been done only for the sake of convenience. Actually, during the tuning cycles and tuning operations described hereinabove, which it must be assumed occur within the the desired tuning range, the right-hand end of resistor 70 is ungrounded or open-circuited. With such open-circuit connection, the tube 53 can fire as described and the relay circuit 30 is enabled and will function in the manner described.

The following values are given only by way of example for the resistors in circuit 30. These were the values employed in an arrangement according to this invention which was built and successfully tested. The types of tubes utilized at 46, 53 and 55 have previously been stated.

| | Ohms |
|---|---|
| Resistor 44 | 330,000 |
| Resistor 48 | 1,000 |
| Resistor 52 | 39,000 |
| Resistor 57 | 330,000 |
| Resistor 58 | 100,000 |
| Resistor 59 | 2,700 |
| Resistor 60 | 27,000 |
| Resistor 70 | 18,000 |

What is claimed is:

1. A frequency control system for an oscillator comprising in combination, an oscillator the frequency of which is variable, a phase discriminator-detector having two alternating current input circuits, means for applying to one of said circuits a wave the frequency of which is representative of the frequency of said oscillator, means for applying to the other circuit a wave of reference frequency, an electronic variable reactance coupled to the frequency-determining circuit of said oscillator, connections for applying direct current output from said discriminator to said reactance to control the reactive effect thereof, means for sweeping said oscillator through a frequency range greater than the lock-in range of said reactance and including a predetermined frequency which will cause said representative frequency to be equal to said reference frequency, thereby causing said discriminator-detector to act as a phase discriminator-detector and to produce a variable D. C. output as the phase relation between the representative frequency and the reference frequency varies, the taking of control of said oscillator by said reactance, and the losing of control of said oscillator by said reactance, at the two limits of its lock-in range, defining a voltage pulse of predetermined polarity produced at the output of said discriminator, and means for utilizing said pulse to vary a characteristic of said frequency sweeping means.

2. A system in accordance with claim 1, wherein the sweeping means comprises a motor mechanically coupled to a tuning capacitor in the oscillator and wherein the voltage pulse produced at the output of the discriminator is utilized to vary the speed of rotation of said capacitor by said motor.

3. A system in accordance with claim 1, wherein the sweeping means comprises a motor mechanically coupled to a tuning capacitor in the oscillator and wherein the voltage pulse produced at the output of the discriminator is utilized to vary the direction of rotation of said capacitor by said motor.

4. A system in accordance with claim 1, wherein the sweeping means comprises a motor mechanically coupled to a tuning capacitor in the oscillator and wherein the voltage pulse produced at the output of the discriminator is utilized to vary the direction and speed of rotation of said capacitor by said motor.

5. A system in accordance with claim 1, wherein the sweeping means comprises a motor mechanically coupled through a reversing and speed changing clutch to a tuning capacitor in the oscillator and wherein the voltage pulse produced at the output of the discriminator is utilized to control the energization of said clutch, thereby to vary the direction and speed of rotation of said capacitor by said motor.

6. A frequency control system for an oscillator comprising in combination, an oscillator the frequency of which is variable, said oscillator being provided with a tuning reactance, a phase discriminator having two alternating current input circuits, means for applying to one of said circuits a wave the frequency of which is representative of the frequency of said oscillator, means for applying to the other of said circuits a wave of reference frequency, an electronic reactance coupled to said oscillator for varying the frequency thereof, means for applying direct current output from said discriminator to said electronic reactance to control the reactance thereof, a tuning motor mechanically coupled to said tuning reactance to rotate the same, means in said coupling for varying the speed of rotation of said tuning reactance, and means responsive to the direct current output of said discriminator for controlling said speed varying means.

7. A system in accordance with claim 6, wherein the coupling between the motor and the tuning reactance also includes means for varying the direction of rotation of said tuning reactance and wherein such direction-varying means is controlled in response to the direct current output of the discriminator.

8. A frequency control system for an oscillator comprising in combination, an oscillator the frequency of which is variable, a phase discriminator having two alternating current input circuits, means for applying to one of said circuits a wave the frequency of which is representative of the frequency of said oscillator, means for applying to the other circuit a wave of reference frequency, an electronic reactance coupled to said oscillator for varying the frequency thereof, means for applying direct current output from said discriminator to said reactance to control the reactive effect thereof, means for sweeping said oscillator in a certain direction through a frequency range greater than the lock-in range of said reactance and including a predetermined frequency which will cause said representative frequency to be equal to said reference frequency, thereby developnig a unidirectional voltage pulse of one polarity at the output of said discriminator as the oscillator passes through said predetermined frequency, means for utilizing said pulse to reverse the direction of sweep of said frequency sweeping means, said frequency sweeping means thereafter sweeping said oscillator in the opposite direction through a frequency range including said predetermined frequency, thereby developing at the discriminator output a unidirectional voltage of a polarity opposite to said one polarity, and means for utilizing said last-named voltage to disable said sweeping means.

9. A system in accordance with claim 8, wherein the sweeping means comprises a motor mechanically coupled to a tuning capacitor in the oscillator and wherein the said voltage pulse of one polarity is utilized to reverse the direction of rotation of said capacitor by said motor.

10. A system in accordance with claim 8, wherein the sweeping means comprises a motor mechanically coupled through a reversing clutch to a tuning capacitor in the oscillator and wherein the said voltage pulse of one polarity is utilized to effect the energization of said clutch, thereby to reverse the direction of rotation of said capacitor by said motor.

11. A system in accordance with claim 8, wherein the sweeping means comprises a motor mechanically coupled to a tuning capacitor in the oscillator and wherein the means which acts to disable the sweeping means includes a relay, energized in response to the unidirectional voltage of opposite polarity, which acts to disconnect the motor from its source of driving power.

12. A system in accordance with claim 10, wherein the means which acts to disable the sweeping means includes a relay, energized in response to the unidirectional voltage of opposite polarity, which acts to disconnect the motor from its source of driving power.

13. A frequency control system for an oscillator comprising in combination, an oscillator the frequency of which is variable, means for mixing a wave the frequency of which is representative of the frequency of said oscillator with a wave the frequency of which is selectable in steps at will, to provide a beat frequency resultant wave, a phase discriminator having two alternating current input circuits, means for applying said resultant wave to one of said circuits, means for applying to the other of said circuits a reference frequency wave the frequency of which is selectable in steps at will, a reactance tube coupled to said oscillator for varying the frequency thereof, means for applying direct current output from said discriminator to said tube to control the reactance thereof, means for sweeping said oscillator in a certain direction through a frequency range greater than the lock-in range of said tube and including a predetermined frequency which will cause said beat frequency to be equal to the selected reference frequency, thereby developing a unidirectional voltage pulse of one polarity at the output of said discriminator as the oscillator passes through said predetermined frequency, means for utilizing said pulse to reverse the direction of sweep and to vary the speed of sweep of said frequency sweeping means, said frequency sweeping means thereafter sweeping said oscillator in the opposite direction through a frequency range including said predetermined frequency, thereby developing at the discriminator output a unidirectional voltage of a polarity opposite to said one polarity, and means for utilizing said last-named voltage to disable said sweeping means.

14. A system in accordance with claim 13, wherein the sweeping means comprises a motor mechanically coupled to a tuning capacitor in the oscillator and wherein the said voltage pulse of one polarity is utilized to reverse the direction of rotation of said capacitor by said motor and to vary the speed of rotation of said capacitor by said motor.

15. A system in accordance with claim 13, wherein the sweeping means comprises a motor mechanically coupled through a reversing and speed changing clutch to a tuning capacitor in the oscillator and wherein the said voltage pulse of one polarity is utilized to effect the energization of said clutch thereby to reverse the direction of rotation of said capacitor by said motor and to vary the speed of rotation of said capacitor by said motor.

16. A system in accordance with claim 15, wherein the means which acts to disable the sweeping means includes a relay, energized in response to the unidirectional voltage of opposite polarity, which acts to disconnect the motor from its source of driving power.

17. A frequency control system for an oscillator comprising in combination, an oscillator the frequency of which is variable, said oscillator being provided with a tuning reactance, a phase discriminator having two alternating current input circuits, means for applying to one of said circuits a wave the frequency of which is representative of the frequency of said oscillator, means for applying to the other of said circuits a wave of reference frequency, an electronic reactance coupled to said oscillator for varying the frequency thereof, means for applying direct current output from said discriminator to said electronic reactance to control the reactance thereof, a tuning motor mechanically coupled to said tuning reactance to rotate the same, a reversing and speed changing clutch in said coupling, and means responsive to the direct current output of said discriminator for controlling the energization of said clutch.

References Cited in the file of this patent

UNITED STATES PATENTS

| | | |
|---|---|---|
| 2,425,733 | Gille | Aug. 19, 1947 |
| 2,452,601 | Ranger | Nov. 2, 1948 |
| 2,541,454 | White | Feb. 13, 1951 |
| 2,555,391 | Bach | June 5, 1951 |
| 2,568,412 | Robinson | Sept. 18, 1951 |